United States Patent
Wang et al.

(10) Patent No.: US 9,854,235 B2
(45) Date of Patent: Dec. 26, 2017

(54) METHODS AND DEVICES FOR ENTROPY CODING IN SCALABLE VIDEO COMPRESSION

(71) Applicant: RESEARCH IN MOTION LIMITED, Waterloo (CA)

(72) Inventors: Jing Wang, Waterloo (CA); Dake He, Waterloo (CA); Xiang Yu, Kitchener (CA); Tianying Ji, Toronto (CA)

(73) Assignee: BlackBerry Limited, Waterloo, Ontario (CA)

( * ) Notice: Subject to any disclaimer, the term of this patent is extended or adjusted under 35 U.S.C. 154(b) by 426 days.

(21) Appl. No.: 13/777,079

(22) Filed: Feb. 26, 2013

(65) Prior Publication Data

US 2014/0064365 A1 Mar. 6, 2014

Related U.S. Application Data

(60) Provisional application No. 61/695,653, filed on Aug. 31, 2012.

(51) Int. Cl.
*H04N 7/26* (2006.01)
*H04N 19/61* (2014.01)
(Continued)

(52) U.S. Cl.
CPC ....... *H04N 19/00781* (2013.01); *H04N 19/13* (2014.11); *H04N 19/176* (2014.11);
(Continued)

(58) Field of Classification Search
CPC ........ H04N 19/13; H04N 19/44; H04N 19/61; H04N 19/70; H04N 19/91; H04N 19/176; H04N 19/197; H03M 7/4018
(Continued)

(56) References Cited

U.S. PATENT DOCUMENTS

2006/0153294 A1* 7/2006 Wang .................. H04N 19/197
375/240.08
2006/0158355 A1* 7/2006 Jeon ...................... H04N 19/176
341/50
(Continued)

FOREIGN PATENT DOCUMENTS

EP   1746839        1/2007
EP   1746839 A1    1/2007
(Continued)

OTHER PUBLICATIONS

Choi et al., "The report of CE 3 Improved coding efficiency of entropy coding," Joint Video Team (JVT) of ISO/IEC MPEG & ITU-T VCEG (ISO/IEC JTC1/SC29/WG11 and ITU-T SG16 Q.6), 16th Meeting: Poznan, Poland, Jul. 25-29, 2005.*
(Continued)

*Primary Examiner* — Gims Philippe
*Assistant Examiner* — Daniel Chang
(74) *Attorney, Agent, or Firm* — Rowand LLP

(57) ABSTRACT

Methods and devices for decoding, in a video decoder, a block of enhancement-layer transform domain data for an enhancement-layer encoded video and corresponding to a reconstructed block of reference-layer transform domain data, are provided. The method includes determining a context for an enhancement-layer element based, at least in part, upon elements in the corresponding reconstructed block of reference-layer transform domain data, wherein the elements are identified by a template and wherein the position of the template in the reference-layer reconstructed block is based upon the position of that enhancement-layer element in the block of enhancement-layer transform domain data.

19 Claims, 11 Drawing Sheets

(51) Int. Cl.

| | | |
|---|---|---|
| H04N 19/176 | (2014.01) | |
| H04N 19/70 | (2014.01) | |
| H04N 19/30 | (2014.01) | |
| H04N 19/13 | (2014.01) | |
| H04N 19/91 | (2014.01) | |
| H04N 19/18 | (2014.01) | |
| H04N 19/187 | (2014.01) | |
| H03M 7/40 | (2006.01) | |
| H03M 7/30 | (2006.01) | |
| H04N 19/597 | (2014.01) | |
| H04N 19/129 | (2014.01) | |
| H04N 19/59 | (2014.01) | |

(52) U.S. Cl.
CPC ........... *H04N 19/18* (2014.11); *H04N 19/187* (2014.11); *H04N 19/30* (2014.11); *H04N 19/61* (2014.11); *H04N 19/70* (2014.11); *H04N 19/91* (2014.11); *H03M 7/3079* (2013.01); *H03M 7/4018* (2013.01); *H04N 19/129* (2014.11); *H04N 19/59* (2014.11); *H04N 19/597* (2014.11)

(58) Field of Classification Search
USPC ............ 375/240.12, 240.16, 240.26, 240.28, 375/240.08, 240.24, 240.18; 341/50
See application file for complete search history.

(56) References Cited

U.S. PATENT DOCUMENTS

| | | | |
|---|---|---|---|
| 2006/0209959 A1 | 9/2006 | Sun | |
| 2006/0233254 A1* | 10/2006 | Lee .................. | H04N 19/70 375/240.16 |
| 2007/0071331 A1 | 3/2007 | Liu | |
| 2008/0080620 A1* | 4/2008 | Lee .................. | H04N 19/61 375/240.24 |
| 2010/0020871 A1* | 1/2010 | Hannuksela et al. .... | 375/240.12 |
| 2011/0096834 A1 | 4/2011 | Cheon et al. | |
| 2011/0122944 A1* | 5/2011 | Gupta et al. ............. | 375/240.12 |
| 2011/0249721 A1 | 10/2011 | Karczewicz et al. | |
| 2013/0182773 A1* | 7/2013 | Seregin .................. | H04N 19/13 375/240.18 |

FOREIGN PATENT DOCUMENTS

| | | |
|---|---|---|
| EP | 2154894 | 2/2010 |
| WO | 2007008015 A1 | 1/2007 |
| WO | 2007008018 A1 | 1/2007 |
| WO | WO 2007009875 A2 * | 1/2007 |
| WO | 2008108534 | 9/2008 |
| WO | 2011128303 | 10/2011 |

OTHER PUBLICATIONS

Marpe, H. Schwarz, and T. Wiegand, "Context-based adaptive binary arithmetic coding in the h.264/AVC video compression standard," IEEE Transactions on Circuits and Systems for Video Technology, 13(7):620-636, Jul. 2003.

B. Bross, W-J Han, J-R Ohm, G. J. Sullivan, and T. Wiegand, "WD4: Working Draft 4 of High-Efficiency Video Coding," JCT-VC of ITU-T SG16 WP3 and ISO/IEC JTC1/SC29/WG11, 6th Meeting, Torino, Jul. 2011.

F. Bossen, "Common test conditions and software reference configurations", JCTVC-F900, JCT-VC of ITU-T SG16 WP3 and ISO/IEC JTC1/SC29/WG11, 6th Meeting, Torino, Jul. 2011.

T. Nguyen, T. Winken, D. Marpe et al., "Reduced-complexity entropy coding of transform coefficient levels using a combination of VLC and PIPE", JCTVC-D336, JCT-VC of ITU-T SG16 WP3 and ISO/IEC JTC1/SC29/WG11, 4th Meeting, Daegu, Jan. 2011.

EPO Partial Search Report relating to application No. 11187410.3 dated Feb. 15, 2012.

Nguyen, Nguyen et al., "Multi-Level Significance Maps for Large Transform Units", Joint Collaborative Team on Video Coding (JCT-VC) of ITU-T SG16 WP3 and ISO/IEC JTC1/SC29/WG11, No. JCTVC-G644, Nov. 9, 2011.

EPO, Extended European Search Report relating to application No. 11187410.3 dated Jun. 19, 2012.

EPO, Extended European Search Report relating to application No. 12164134.4 dated Feb. 15, 2013.

Nguyen, N. et al; "Multi-level Significant Maps for Large Transform Units", 7. JCT-VC Meeting; 98. MPEG Meeting; Nov. 21, 2011-Nov. 30, 2011; Geneva; (Joint Collaborative Team on Video Coding of ISO/EIC JTC1/SC29/WG11 and ITU-T SG. 16); URL:http://wftp3.itu.int/au-arch/jctvc.site/ No. JCTVC-G644, Nov. 9, 2011, XP030110628.

Bross, B. et al; WD4: Working Draft 4 of High-Efficiency Video Coding, 6 JCT-VC Meeting; 97 MPEG Meeting; Jul. 14, 2011-Jul. 22, 2011; Torino; (Joint Collaborative Team on Video Coding of ISO/IEC JTC1/SC29/WG11 and ITU-T SG. 16); URL: http://wftp3.itu.int/av-arch/jctvc-site/,, No. JCTVC-F803, Sep. 8, 2011, XP030009800.

Antoine Robert, et al., "Improving Intra Mode Coding in H.264/AVC Through Block Oriented Transforms", 2006 IEEE 8th Workshop on Multimedia Signal Processing, p. 382.

Cuiling Lan, et al,"Intra Transform Skipping", JCTVC-I0408, Joint Collaborative Team on Video Coding (JCT-VC).

EPO, Extended European Search Report relating to application No. 12173938.7 dated Oct. 9, 2012.

Lan, C et al., Intra and Inter Coding Tools for Screen Contents, 20110310, No. JCTVC-E145, Mar. 10, 2011, XP030008651, ISSN: 0000-0007, paragraph [03.3].

Marta, Mrak et al., Transform Skip Mode, 7. JCT-VC Meeting; 98. MPEG Meeting; Nov. 21, 2011-Nov. 30, 2011; Geneva; (Joint Collaborative Team on Video Coding of ISO/IEC JTC1/SC29/WG11 and ITU-T SG. 16); URL: http://wftp3.it.int/av-arch/jctvc-site/,, No. JCTVC-G575, Nov. 8, 2011 (Nov. 8, 2011), XP030110559, abstract; figure 1.

B. Bross, W-J Han, J-R Ohm, G. J. Sullivan, and T. Wiegand, "High effciency vido coding (HVEC) text specification draft 6," JCT-VC of ITU-T SG16 WP3 and ISO/IEC JTC1/SC29/WG11, 8th Meeting, San Jose, JCTVC-H1003.

Tsukuba, T., et al., "Refined significance map context derivation for large TU", JCTVC-J0068r1.

EPO, Extended European Search Report relating to Application No. 13157126.7 dated Apr. 2, 2014.

Choi W et al.: "The report of CE 3 Improve coding efficiency of entropy coding" dated Apr. 21, 2005, XP030005969.

Choi W et al.: "CE03: CE report coding eff. improvement of CABAC" dated Jul. 26, 2005, XP030006105.

W-J Chien et al.: "Template-based context modeling for coefficient coding" dated Apr. 17, 2012, XP030112146.

Choi et al.: "The Report of CE 3 Improve Coding Efficiency of Entropy Coding", Joint Video Team (JVT) 72. MPEG Meeting of ISO/IEC JTC1/SC29/WG11 and ITU-T SG. 16, Busan, KR, held on Apr. 16-22, 2005, Apr. 2005, XP030005969, URL: http://wftp3.itu.int/av-arch/jvt-site/2005_04_Busan, Document No. JVT-O021r1.doc.

Choi et al.: "The Report of CE 3 Improve Coding Efficiency of Entropy Coding", Joint Video Team (JVT) 73. MPEG Meeting of ISO/IEc JTC1/SC29NVG11 and ITU-T SC. 16, Poznan, PL, held on Jul. 24-29, 2005, Jul. 2005, XP030006105, URL: http://wftp3.itu.int/av-arch/jvt-site/2005_07_07_Poznan, Document No. JVT-P067.doc.

CIPO, CA Office Action relating to Application No. 2,807,919, dated Jan. 23, 2015.

EPO, EP Office Action relating to Application No. 13157126.7, dated Sep. 29, 2016.

Choi et al.: "The report of CE 3 Improve coding efficiency of entropy coding", 15. JCT Meeting; 72. MPEG Meeting; Apr. 16, 2005-Apr. 22, 2005; Poznan, PI; (Joint Video Team of ISO/IEC JTC1/SC29/WG11 and ITU-T SG.16). No. JVT-O021r1, Apr. 21, 2005, XP030005969.

(56) References Cited

OTHER PUBLICATIONS

Choi et al.: "CE03: Ce report coding eff. improvement of CABAC", 16. JCT Meeting, 73. MPEG Meeting Jul. 24, 2005-Jul. 29, 2005; Poznan, PI; (Joint Video Team of ISO/IEC JTC1/SC29/WG11 and ITU-T SG. 16), No. JVT-P067r1, Jul. 26, 2005, XP03006105, ISSN: 0000-0416.

Chien et al.: "Template-based context modelling for coefficient coding", 9. JCT-VC Meeting; 100. MPEG Meeting; Apr. 27, 2012-May 7, 2012; Geneva; (Joint Collaborative Team on Video Coding of ISO/IEC JTC1/SC29N/WG11 and ITU-T SG. 16), No. JCTVC-I0383, Apr. 17, 2012, XP030112146.

* cited by examiner

METHODS AND DEVICES FOR ENTROPY CODING IN SCALABLE VIDEO COMPRESSION

CROSS-REFERENCE TO RELATED APPLICATIONS

The present application claims priority to U.S. provisional patent application Ser. No. 61/695,653, filed Aug. 31, 2012, the contents of which are hereby incorporated by reference.

COPYRIGHT NOTICE

A portion of the disclosure of this document and accompanying materials contains material to which a claim for copyright is made. The copyright owner has no objection to the facsimile reproduction by anyone of the patent document or the patent disclosure, as it appears in the Patent and Trademark Office files or records, but reserves all other copyright rights whatsoever.

FIELD

The present application generally relates to data compression and, in particular, to methods and devices for scalable video compression.

BACKGROUND

Data compression occurs in a number of contexts. It is very commonly used in communications and computer networking to store, transmit, and reproduce information efficiently. It finds particular application in the encoding of images, audio and video. Video presents a significant challenge to data compression because of the large amount of data required for each video frame and the speed with which encoding and decoding often needs to occur. The current state-of-the-art for video encoding is the ITU-T H.264/AVC video coding standard. It defines a number of different profiles for different applications, including the Main profile, Baseline profile and others. A next-generation video encoding standard is currently under development through a joint initiative of MPEG-ITU termed High Efficiency Video Coding (HEVC/H.265).

There are a number of standards for encoding/decoding images and videos, including H.264 and HEVC/H.265, that use block-based coding processes. In these processes, the image or frame is partitioned into blocks and the blocks are spectrally transformed into coefficients, quantized, and entropy encoded. In many cases, the data being transformed is not the actual pixel data, but is residual data following a prediction operation. Predictions can be intra-frame, i.e. block-to-block within the frame/image, or inter-frame, i.e. between frames (also called motion prediction).

When spectrally transforming residual data, many of these standards prescribe the use of a discrete cosine transform (DCT) or some variant thereon. The resulting DCT coefficients are then quantized using a quantizer to produce quantized transform domain coefficients, or indices.

The block or matrix of quantized transform domain coefficients (sometimes referred to as a "transform unit") is then entropy encoded using a particular context model. In H.264/AVC and HEVC/H.265, the quantized transform coefficients are encoded by (a) encoding a last significant coefficient position indicating the location of the last non-zero coefficient in the transform unit, (b) encoding a significance map indicating the positions in the transform unit (other than the last significant coefficient position) that contain non-zero coefficients, (c) encoding the magnitudes of the non-zero coefficients, and (d) encoding the signs of the non-zero coefficients.

Scalable video coding involves encoding a reference layer and an enhancement layer (and, in some cases, additional enhancement layers, some of which may also serve as reference layers). The reference layer is encoded using a given video codec. The enhancement layer is encoded using the same video codec, but the encoding of the enhancement layer may take advantage of information from the reconstructed reference layer to improve its compression. In particular, in the case of spatial scalable video compression (where the reference layer is a scaled-down version of the enhancement layer), a temporally co-located reconstructed reference layer frame may be used as the reference frame for a prediction in the equivalent frame at the enhancement layer. This is termed "inter-layer" prediction.

It would be advantageous to develop scalable video coding and decoding processes that improve compression at the enhancement layer.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
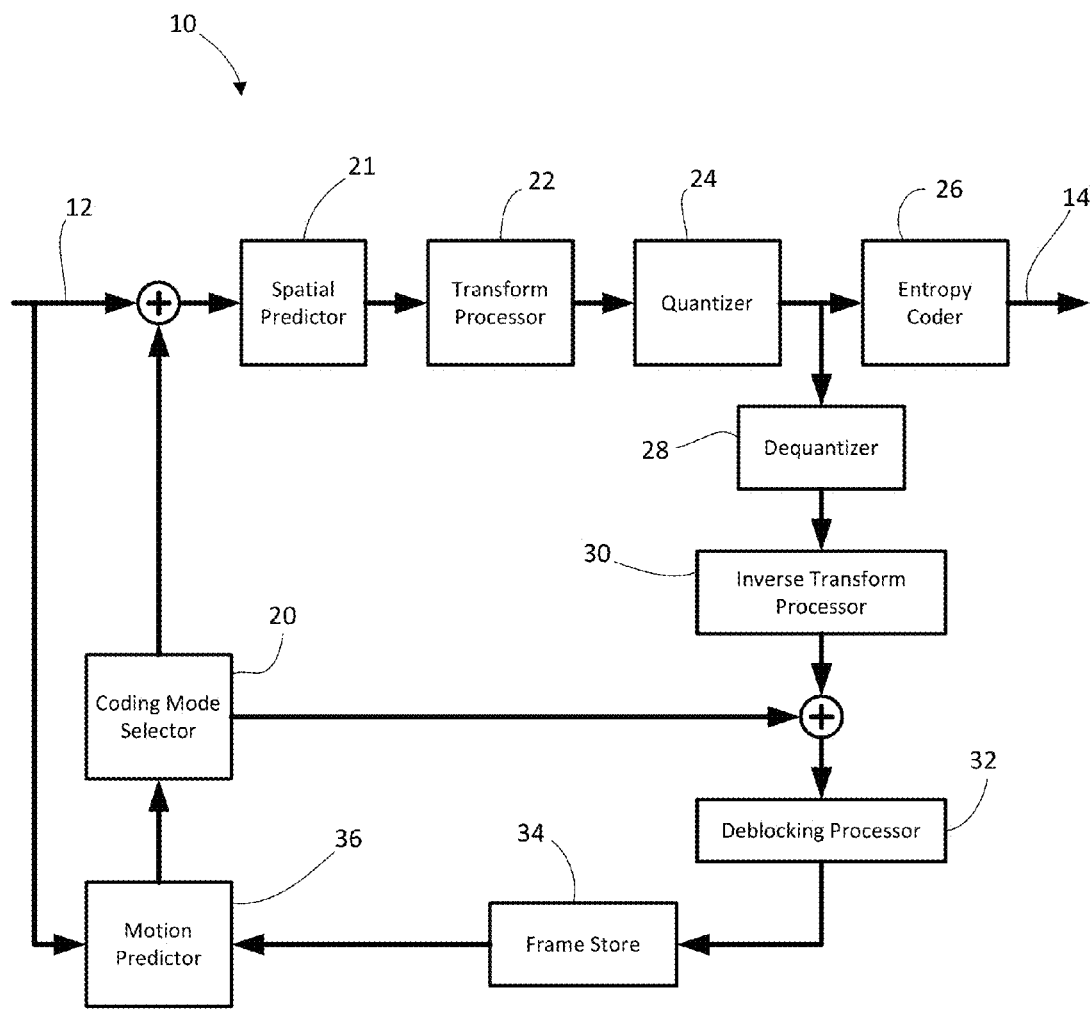
FIG. 1 shows, in block diagram form, an encoder for encoding video.

The present application describes methods and encoders/decoders for encoding and decoding residual video data.

In a first aspect, the present application describes a method of decoding, in a video decoder, a block of enhancement-layer transform domain data for an enhancement-layer encoded video and corresponding to a reconstructed block of reference-layer transform domain data. The method includes, for an enhancement-layer element of the block of enhancement-layer transform domain data, determining a context for that enhancement-layer element based, at least in part, upon elements in the reconstructed block of reference-layer transform domain data, wherein the elements are identified by a template and wherein the position of the template in the reconstructed block of reference-layer transform domain data is based upon the position of that enhancement-layer element in the block of enhancement-layer transform domain data; and entropy decoding that enhancement-layer element using its determined context.

In another aspect, the present application describes a method of decoding a bitstream of scalable video in a video decoder, wherein the scalable video includes an enhancement layer and a reference layer, and wherein the enhancement layer is partly defined by an enhancement-layer significance map and the reference layer is partly defined by a reference-layer significance map. The method includes reconstructing the reference-layer significance map by reconstructing a set of reference-layer significant-coefficient-group flags and, for each non-zero reference-layer significant-coefficient-group flag, decoding corresponding significant-coefficient flags; and reconstructing the enhancement-layer significance map by reconstructing a set of enhancement-layer significant-coefficient-group flags, for each non-zero enhancement-layer significant-coefficient-group flag, decoding a set of enhancement-layer significant-coefficient-subgroup flags, and for each non-zero enhancement-layer significant-coefficient-subgroup flag, decoding corresponding significant-coefficient flags.

In a further aspect, the present application describes encoders and decoders configured to implement such methods of encoding and decoding.

In yet a further aspect, the present application describes non-transitory computer-readable media storing computer-executable program instructions which, when executed, configured a processor to perform the described methods of encoding and/or decoding.

Other aspects and features of the present application will be understood by those of ordinary skill in the art from a review of the following description of examples in conjunction with the accompanying figures.

In the description that follows, some example embodiments are described with reference to the H.264 standard for video coding and/or the developing HEVC/H.265 standard. In particular, reference may be made to H.264/SVC for scalable video coding, or a scalable video coding extension to the HEVC/H.265 standard. Those ordinarily skilled in the art will understand that the present application is not limited to H.264/SVC or HEVC/H.265 but may be applicable to other scalable video coding/decoding standards, including possible future standards, including multi-view coding standards, 3D video coding standards, and reconfigurable video coding standards. In that regard, some example embodiments below refer to scalable video and a reference layer and an enhancement layer within scalable video. It will be appreciated that in 3D or multiview coding, the 'reference layer' may be a single view and that the 'enhancement layer' may be additional view(s). Suitable modifications to the described embodiments to extend these concepts from scalable video to 3D and/or multiview coding will be appreciated by those ordinarily skilled in the field in light of the full description below.

In the description that follows, when referring to video or images the terms frame, picture, slice, tile and rectangular slice group may be used somewhat interchangeably. Those of skill in the art will appreciate that, in the case of the H.264 standard, a frame may contain one or more slices. The term "frame" may be replaced with "picture" in HEVC/H.265. Other terms may be used in other video coding standards. It will also be appreciated that certain encoding/decoding operations might be performed on a frame-by-frame basis, some are performed on a slice-by-slice basis, some picture-by-picture, some tile-by-tile, and some by rectangular slice group, by coding unit, by transform unit, etc., depending on the particular requirements or terminology of the applicable image or video coding standard. In any particular embodiment, the applicable image or video coding standard may determine whether the operations described below are performed in connection with frames and/or slices and/or pictures and/or tiles and/or rectangular slice groups and/or coding or transform units, as the case may be. Accordingly, those ordinarily skilled in the art will understand, in light of the present disclosure, whether particular operations or processes described herein and particular references to frames, slices, pictures, tiles, rectangular slice groups are applicable to frames, slices, pictures, tiles, rectangular slice groups, or some or all of those for a given embodiment. This also applies to transform units, coding units, groups of coding units, etc., as will become apparent in light of the description below.

Figure 2:
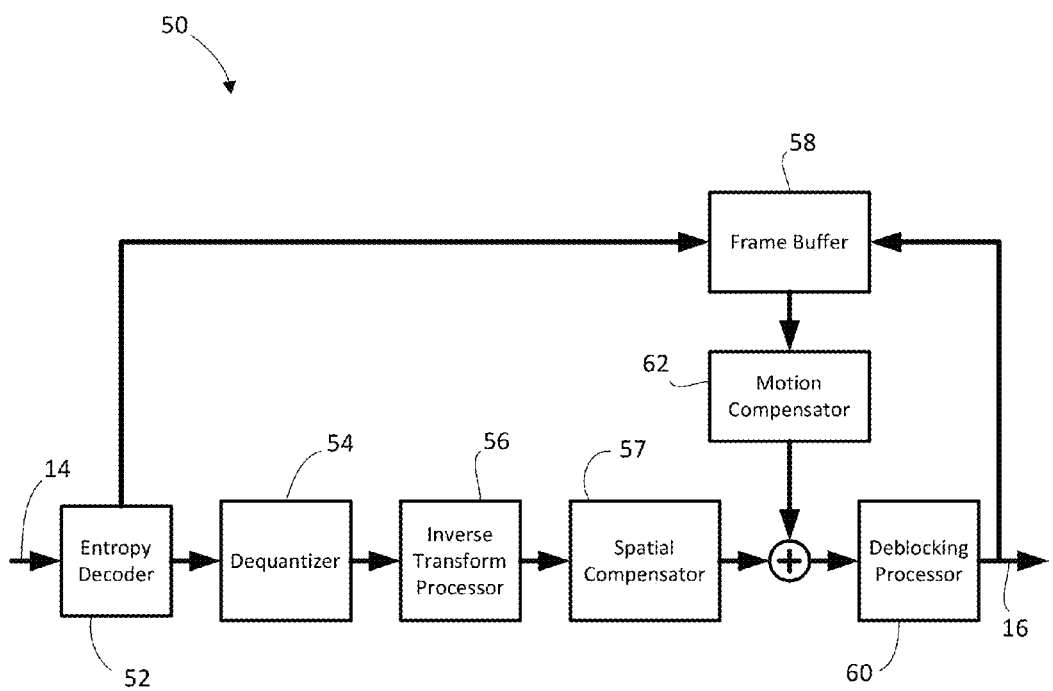
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 is a single-layer encoder and the decoder 50 is a single-layer decoder. The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard, like HEVC/H.265.

The encoder 10 includes a spatial predictor 21, a coding mode selector 20, transform processor 22, quantizer 24, and entropy encoder 26. As will be appreciated by those ordinarily skilled in the art, the coding mode selector 20 determines the appropriate coding mode for the video source, for example whether the subject frame/slice is of I, P, or B type, and whether particular coding units (e.g. macroblocks, coding units, etc.) within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. The block-based transform is performed on a coding unit, macroblock or sub-block basis, depending on the size of the macroblocks or coding units. In the H.264 standard, for example, a typical 16×16 macroblock contains sixteen 4×4 transform blocks and the DCT process is performed on the 4×4 blocks. In some cases, the transform blocks may be 8×8, meaning there are four transform blocks per macroblock. In yet other cases, the transform blocks may be other sizes. In some cases, a 16×16 macroblock may include a non-overlapping combination of 4×4 and 8×8 transform blocks.

Applying the block-based transform to a block of pixel data results in a set of transform domain coefficients. A "set" in this context is an ordered set in which the coefficients have coefficient positions. In some instances the set of transform domain coefficients may be considered as a "block" or matrix of coefficients. In the description herein the phrases a "set of transform domain coefficients" or a "block of transform domain coefficients" are used interchangeably and are meant to indicate an ordered set of transform domain coefficients.

The set of transform domain coefficients is quantized by the quantizer 24. The quantized coefficients and associated information are then encoded by the entropy encoder 26.

The block or matrix of quantized transform domain coefficients may be referred to herein as a "transform unit" (TU). In some cases, the TU may be non-square, e.g. a non-square quadrature transform (NSQT).

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. The deblocking processor 32 may include a deblocking processor and a filtering processor. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks or coding units to which motion prediction is applied, the "source data" which the transform processor 22 encodes is the residual data that comes out of the motion prediction process. For example, it may include information regarding the reference frame, a spatial displacement or "motion vector", and residual pixel data that represents the differences (if any) between the reference block and the current block. Information regarding the reference frame and/or motion vector may not be processed by the transform processor 22 and/or quantizer 24, but instead may be supplied to the entropy encoder 26 for encoding as part of the bitstream along with the quantized coefficients.

Those ordinarily skilled in the art will appreciate the details and possible variations for implementing video encoders.

The decoder 50 includes an entropy decoder 52, dequantizer 54, inverse transform processor 56, spatial compensator 57, and deblocking processor 60. The deblocking processor 60 may include deblocking and filtering processors. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock or coding unit, the recreated "video data" is the residual data for use in spatial compensation relative to a previously decoded block within the frame. The spatial compensator 57 generates the video data from the residual data and pixel data from a previously decoded block. In other cases, such as inter-coded macroblocks or coding units, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock or coding unit. It does so based on the reference frame information and motion vector specified for the inter-coded macroblock or coding unit. It then supplies the reference block pixel data for combination with the residual data to arrive at the reconstructed video data for that coding unit/macroblock.

A deblocking/filtering process may then be applied to a reconstructed frame/slice, as indicated by the deblocking processor 60. After deblocking/filtering, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

It is expected that HEVC/H.265-compliant encoders and decoders will have many of these same or similar features.

Figure 3:
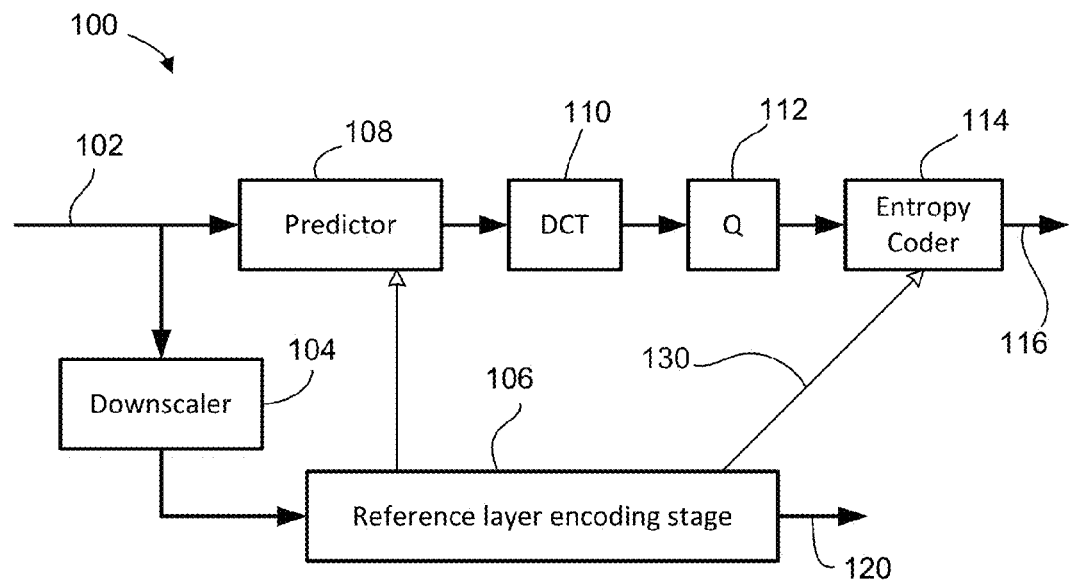
FIG. 3 shows, in block diagram form, an example of a scalable video encoder.
Figure 4:
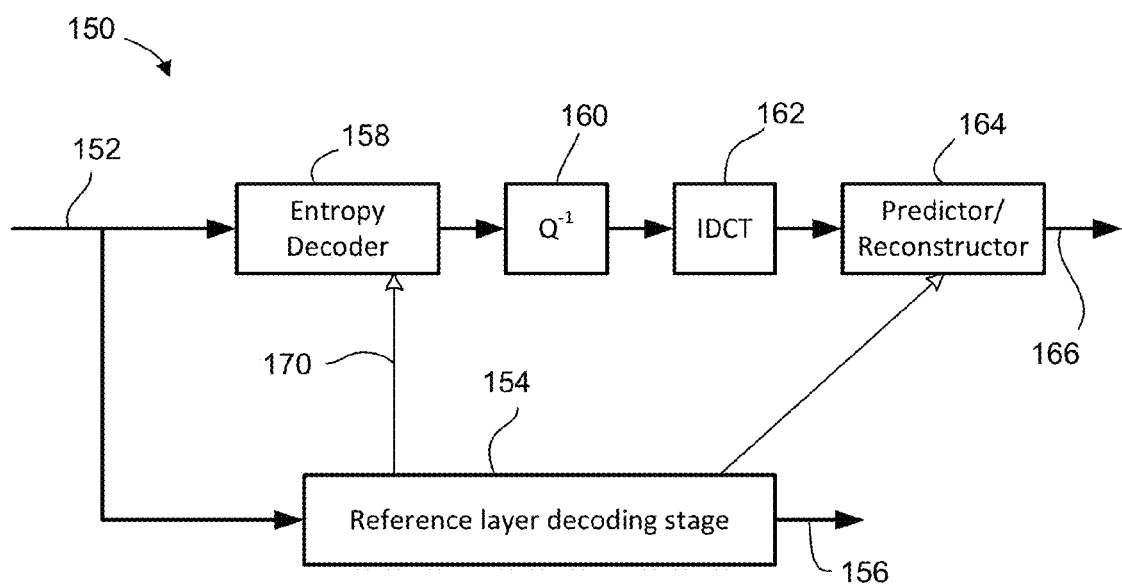
FIG. 4 shows, in block diagram form, an example of a scalable video decoder.

Reference is now made to FIGS. 3 and 4. FIG. 3 shows a simplified block diagram of an example scalable video encoder 100. FIG. 4 shows a simplified block diagram of an example scalable video decoder 150. Scalable video may involve one or more types of scalability. The types of scalability include spatial, temporal, quality (PSNR), and format/standard. In the examples given below, the scalable video is spatially scaled video. That is, the reference-layer video is a scaled-down version of the enhancement-layer video. The scale factor may be 2:1 in the x-direction and 2:1 in the y-direction (overall, a scaling of 4:1), 1.5:1 in the x- and y-directions, or any other ratio.

The encoder 100 receives the enhancement resolution video 102. The encoder 100 includes a downscaler 104 to convert the enhancement resolution video 102 to a reference-layer video. The reference-layer video is then encoded by way of a reference-layer encoding stage 106. The reference-layer encoding stage 106 may be, for example, an HEVC/H.265-compliant encoder that produces reference-layer encoded video 120.

The enhancement-layer video 102 is encoded using a predictor 108, a DCT operator 110, a quantizer 112, and an entropy coder 114. The entropy coder 114 outputs an enhancement-layer encoded video. The difference from single-layer video coding is that data from the reference layer may be used in the predictor 108 to assist in making predictions at the enhancement layer. The predictor 108 may apply intra-prediction, inter-prediction or inter-layer prediction. Inter-layer prediction relies upon data from corresponding pixels in the reference layer as a prediction for the pixels in the enhancement layer. The reference-layer pixels may be up-scaled and the up-scaled pixels may serve as an enhancement layer prediction.

The encoder 100 produces both the reference-layer encoded video 120 and the enhancement-layer encoded video 116. The two encoded videos may be packaged together and/or interleaved in a variety of ways to create a single bitstream, or may be maintained and stored separately, depending on the implementation.

At the decoder 150, scalable encoded video 152 (containing both the reference layer and enhancement layer) is input to a reference-layer decoding stage 154, which is configured to decoder the reference-layer video. It may output reference-layer decoded video 156. The scalable encoded video 152 is also input to an enhancement-layer video decoding stage, which includes an entropy decoder 158, a dequantizer 160, an inverse DCT operator 162, and a predictor/reconstructor 164. As at the encoder, the predictor may rely upon some reference-layer pixel data to generate the pixel prediction used for reconstruction of pixel values in the enhancement layer. The decoder 150 may output reconstructed enhancement-layer video 166. Similarly, at the decoder 150, data 170 from the base-layer decoding stage 154 may be used for context determination in the entropy decoder 158.

In accordance with one aspect of the present application, data 130 reconstructed at the reference-layer stage may be used to improve the entropy coding of the enhancement layer. In particular, reconstructed reference-layer transform domain data may be uses as a factor in determining the context for encoding or decoding a syntax element at the enhancement layer. As an example, when encoding or decoding a significant-coefficient flag in the enhancement layer, one or more significant-coefficient flags or other syntax elements from the same frame/slice in the reconstructed reference-layer may be used to determine the context for coding the enhancement-layer significant-coefficient flag.

In one example, the syntax elements from the reference layer are located in a neighborhood that corresponds to the position of the enhancement layer syntax element for which context is being determined. In some embodiments described below a template is used to identify the reference-layer elements used in determining context at the enhancement layer. In one example, the reference-layer elements are the same type of syntax element as the enhancement-layer syntax element. In another example, the reference-layer elements include syntax elements different from the enhancement-layer syntax element.

As will be described below, when dealing with spatial scalability and the transform domain, a transform unit in the reference layer correlates to the low frequency portion of the corresponding transform unit in the enhancement layer.

Mapping Reference-Layer Transform Coefficients to Enhancement-Layer Transform Coefficients For any transform unit in the enhancement layer, a corresponding set of transform domain residuals may be identified in the reference-layer. As noted, the reference layer data correlates to the lower frequency components of the enhancement layer. In other words, there is a strong correlation between a block of reference-layer transform domain residuals and the upper left portion of the corresponding block transform domain residuals in the enhancement layer.

Figure 5:
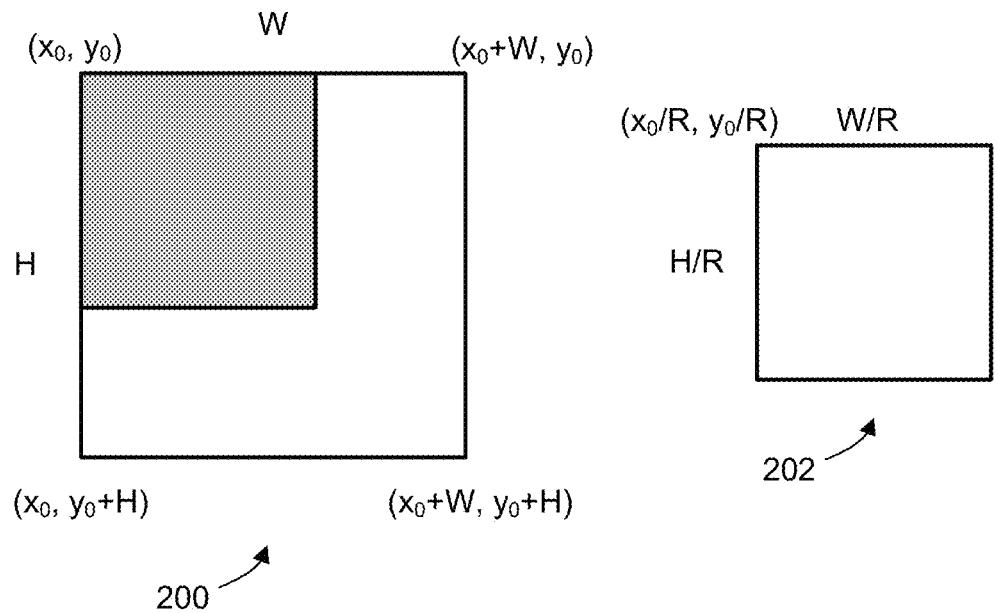
FIG. 5 illustrates the transform domain mapping between enhancement layer transform coefficients and reference layer transform coefficients.

Reference is now made to FIG. 5, which diagrammatically illustrates an enhancement-layer transform unit 200 of transform domain coefficients and its corresponding reference-layer transform domain coefficients 202. The enhancement-layer transform unit 200 has its upper left corner positioned within the frame at $(x_0, y_0)$, and it is of size W×H. if the spatial scale factor between the reference layer and the enhancement layer is R, then the corresponding block of reference-layer transform domain coefficients 202 has its upper left corner located at $(x_0/R, y_0/R)$ in the reference-layer frame and it is of size W/R×H/R.

FIG. 5 shows the portion of the enhancement-layer transform unit 200 the correlates to the block of reference-layer transform domain coefficients 202 with shading. That is, there is a correlation between co-located coefficients when the upper left corners of the blocks are aligned. In other words, for the coefficients in the enhancement layer there is a corresponding coefficient in the reference layer that correlates to it provided the coefficients in the enhancement layer have a position (x, y) within $x_0 \leq x \leq x_0 + W/R$ and $y_0 \leq y \leq y_0 + H/R$.

With an integer scale factor, like 2, the mapping is straightforward. With a non-integer scale factor, such as 1.5, the mapping may involve additional considerations.

With a non-integer scale factor, the corresponding block of reference-layer transform domain coefficients has a top left corner at (x1, y1) where (x1, y1) is the closest integer position to the fractional position $(x_0/R, y_0/R)$. The size of the block of reference-layer data is given by int(W/R)×int(H/R).

Because the reference layer information is reconstructed and available at both the encoder and decoder, it would be advantageous to exploit this information to improve the enhancement layer coding. Further, it may be advantageous to exploit the correlation between transform domain data in the reference layer and transform domain data in the enhancement layer based on the correlation principles discussed above. In some examples described below, information from the reconstructed reference layer is used when determining context for encoding or decoding syntax elements from a corresponding or correlated portion of the enhancement layer.

In some cases, the scale factor is such that the directly-correlated reference layer transform data extends beyond the borders of a coefficient group or set of coefficient groups within the enhancement layer transform unit. For example, if the enhancement layer transform unit is 8×8, and the scale factor is 1.5, the correlated reference layer block of transform coefficients may be 6×6, meaning they cover the upper-left enhancement-layer coefficient group and extend partway into the three other coefficient groups. In these circumstances, in some embodiments it may be advantageous from a modular processing point-of-view (or for other reasons) to limit the mapping of the reference layer transform data to the upper-left coefficient group (or set of coefficient groups), such that the mapping is constrained within coefficient group boundaries. Similarly, the mapping may be constrained to significant-coefficient-sub-group (discussed later below) boundaries.

In some other cases, the corresponding block of the enhancement-layer transform unit in the reference-layer frame may have its upper left corner located at $((x_0+dx)/R, (y_0+dy)/R)$ and it is of size $W/R \times H/R$, where $(dx, dy)$ is the disparity between the reference layer and the enhancement layer, which may be due to, for example, the phase mismatch between the up-sampling/down-sampling filters in the spatial scalable video coding, or the disparity between different views in multiview/3D coding.

Enhancement-Layer Context Determination Using Reference-Layer Coefficient Data

The example embodiments described below use reference-layer coefficient data to determine the context for encoding a correlated portion of an enhancement-layer block of syntax elements (such as, for example, significant coefficient flags). In some implementations, the reference-layer coefficients may be normalized if the quantization step size used at the enhancement layer, $q_e$, is different from the quantization step size used at the reference layer, $q_r$. In such an implementation, the reference-layer coefficient block $U_r$ is normalized as:

$$U_{r'} = U_r * q_r / q_e$$

The size of the enhancement-layer coefficient block $U_e$ is $W_e \times H_e$. The size of the reference-layer coefficient block $U_r$ is $W_r \times H_r$.

The contexts for coding the top-left $W_r \times H_r$ block of $U_e$ may then be derived based on $U_{r'}$ or, in some cases, $U_r$. The context is denoted cntInc in the following examples. In the examples below, for simplicity, only $U_{r'}$ will be referenced. Also, for simplicity, many of the following examples may be based on coding significant-coefficient flags; however, it will be appreciated that the same or similar examples may be used for coding greater-than-one flags, greater-than-two flags, remaining level data, signs, or any other context-coded syntax elements used to code the transform domain coefficients.

In the following examples, elements from the reference-layer are used to determine the context for encoding/decoding a syntax element at the enhancement layer. The reference-layer elements are selected based upon a template. The template identifies the elements in the reference-layer that are factored into the context determination. The template is positioned in the reference-layer based on the position of the syntax element in the enhancement layer. For example, the template (in some cases) may be centred at the co-located correlated coefficient in the reference layer.

Example 1

In one embodiment, the context for encoding/decoding the significant-coefficient flags of $U_e$ is derived based on the $U_{r'}$ as follows:

If $i < W_r$ and $j < H_r$
    ctxInc = $U_{r'}$ (i, j) != 0 ? 1 : 0
Else
    Use conventional single-layer contexts
where (i, j) is the position of the coefficient within $U_e$ or $U_{r'}$.

Note that this context assignment corresponds to applying a mapping of the coefficient position of the block in the enhancement layer to the equivalent position in the corresponding block in the reference layer and using the context defined by the position in the reference layer for the coefficient in the enhancement layer. In this example, the template identifies a single coefficient located in the corresponding position in the reference-layer.

Example 2

In second embodiment, the context for encoding/decoding the significance flag of one coefficient in $U_e$ is derived using both the corresponding base-layer coefficient and its neighbors in $U_{r'}$ as follows:

If $i < W_r$ and $j < H_r$
    sum = ($U_{r'}$ (i, j) != 0) + ($U_{r'}$ (i−1, j) != 0) + ($U_{r'}$ (i, j−1) != 0) +
    ($U_{r'}$ (i+1, j) != 0) + ($U_{r'}$ (i, j+1) != 0)
    ctxInc = min( sum, Th )
Else
    Use conventional single-layer contexts In this example, the template is cross-shaped and identifies the reference-layer coefficient co-located to the enhancement layer syntax element and four of its neighbors: the coefficient above, to the right, below, and to the left. The sum equates to a summing of the reference-layer significant-coefficient flags identified by the cross-shaped template. In this example, the sum is compared to a pre-defined threshold Th to control the number of total contexts. For example, a threshold of Th=3 limits the total number of contexts to 4. Other thresholds may be applied.

Because the reference layer has been reconstructed prior to encoding/decoding the enhancement layer, the coefficients before and after the current position in the scan order are all available for context determination at the enhancement layer. The proposed template uses the corresponding reference-layer coefficient at the same position (denoted by 'C') as the enhancement-layer syntax element, and all of its direct neighbors (denoted by 'X') as shown below:

X
    X  C  X
      X

When 'X' is outside the transform block boundary in the reference layer, it may be assumed to be '0' in some embodiments. It may be assumed to be the same as 'C' in other embodiments.

Example 3

In a third example embodiment, instead of using a single threshold to limit the total number of contexts, multiple thresholds, or correspondingly a mapping function, may be used to map multiple sums to one context. An example of context assignment based on a mapping function $f(x)=\min((x+1)/2, 2)$ is given by:

```
If i < W_r and j < H_r
    sum = (U_r (i, j) != 0) + (U_r (i-1, j) != 0) + (U_r (i, j-1) != 0) +
        (U_r (i+1, j) != 0) + (U_r (i, j+1) != 0)
    ctxInc = min( (sum+1)/2, 2 )
Else
    Use conventional single-layer contexts
```

It will be appreciated that this example uses the same cross-shaped template described above in connection with the second embodiment.

Example 4

In yet another embodiment, the same shaped template may be used but more weight may be given to the reference-layer coefficient that most directly correlates in position to the current enhancement-layer coefficient. In one such example, the context for encoding/decoding the significance flag of one coefficient in $U_e$ is derived by:

```
If i < W_r and j < H_r
    sum = 2*(U_r (i, j) != 0) + (U_r (i-1, j) != 0) + (U_r (i, j-1) != 0) +
        (U_r (i+1, j) != 0) + (U_r (i, j+1) != 0)
    ctxInc = min( (sum+1)/2, 2 )
Else
    Use conventional single-layer contexts
```

This corresponds to applying the following weighted template and a mapping function $f(x)=\min((x+1)/2, 2)$ to the significance map of the reference-layer coefficient block for use in determining context for an element of the enhancement-layer block:

```
    1
  1 2 1
    1
```

Example 5

In all of the above examples, the context determination uses a significance flag test of $U_r(i, j) != 0$. In some other cases, it may be beneficial to use the values of those reference-layer transform coefficients $U_r(i, j)$. For example, the enhancement-layer context determination may be carried out by:

```
If i < W_r and j < H_r
    sum = abs(U_r (i, j)) + abs(U_r (i-1, j)) + abs(U_r (i, j-1)) +
        abs(U_r (i+1, j)) + abs(U_r (i, j+1))
    ctxInc = min( sum/threshold, 2 )
Else
    Use conventional single-layer contexts
```

In a variation of this example embodiment, various thresholds may be defined to map the sum to individual contexts:

```
If i < W_r and j < H_r
    sum = abs(U_r (i, j)) + abs(U_r (i-1, j)) + abs(U_r (i, j-1)) +
        abs(U_r (i+1, j)) + abs(U_r (i, j+1))
    ctxInc = map_fun(sum, threshold1, threshold2)
Else
    Use conventional single-layer contexts
```

Where

```
map_fun(sum, threshold1, threshold2) = 0 ; if sum<threshold1 ;
                                     = 1 ; if threshold1<=sum<threshold2 ;
                                     = 2;  if sum>=threshold2.
```

Example 6

Figure 6:
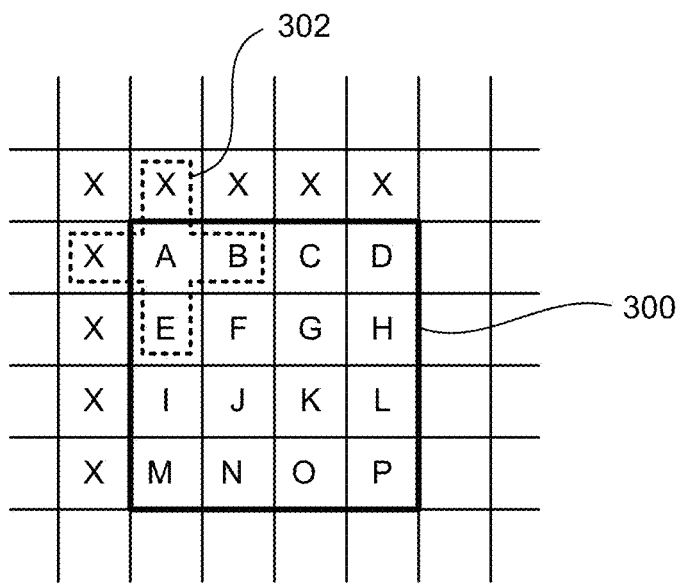
FIG. 6 shows one example of a template for selecting reference-layer elements to determine context for coding a corresponding or correlated enhancement layer element.

In the second example embodiment discussed above, it is noted that the cross-shaped template involves coefficients outside the boundary of the reference-layer block of transform coefficients when dealing with an enhancement-layer element at the boundaries. This is especially noticeable at the DC coefficient. FIG. 6 illustrates an example block of reference-layer transform coefficients 300, in which 'A' is the reference-layer coefficient corresponding to the enhancement-layer DC coefficient. The cross-shaped template positioned at the coefficient corresponding to the enhancement-layer DC coefficient is indicated by reference numeral 302. It will be noted that the template 302 ends up including two 'X' coefficients outside the block of reference-layer transform domain coefficients. These coefficients outside the reference-layer block boundary are not well correlated to the enhancement-layer transform block being coded. This, plus the fact that the DC coefficient often has different statistics than other coefficients, means that it may be advantageous to modify the context determination for this coefficient.

As noted in the second example embodiment, one option is to treat 'X' coefficients, i.e. coefficients outside the reference-level block boundary, as zeros. In other words:

```
sum = (A != 0 ) + (B != 0) + (E != 0)
ctxInc = min((sum+1)/2, 2)
```

Another option is to treat 'X' coefficients as having the same value as the coefficient corresponding to the DC coefficient, i.e. the same as the 'A' coefficient. In the case of determining context for the DC coefficient, then the following technique may be applied:

```
sum = 3*(A != 0 ) + (B != 0) + (E != 0)
ctxInc = min((sum+1)/2, 2)
```

Figure 7:
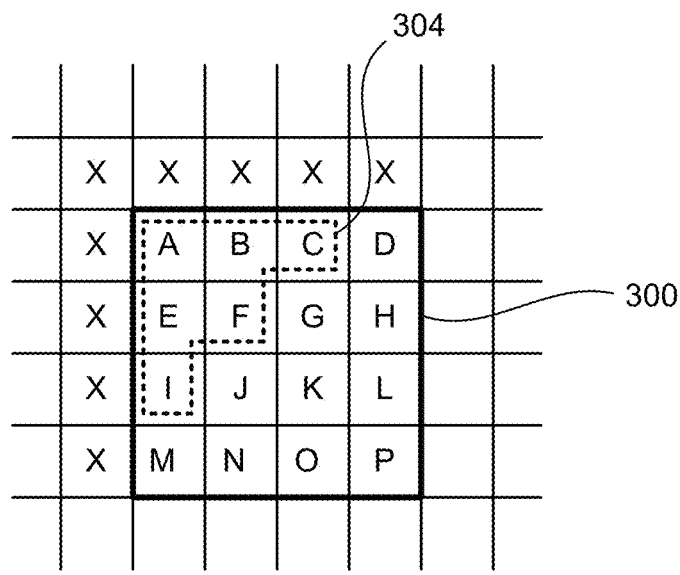
FIG. 7 shows a template for the DC coefficient.

Yet another option is to use a different template when dealing with the DC coefficient. FIG. 7 shows the example block of reference-layer transform coefficients 300 with a DC-specific template 304. In this template 304, the reference-layer coefficient positions included in the template 304 are the DC position 'A', and neighboring positions 'B', 'C', 'E', 'F', and 'I', all of which are within the block boundaries. It will be appreciated that other templates could also be used, such as one including only positions 'A', 'B', 'E', and 'F', or one including positions 'A', 'B', 'C', 'E', and 'I', or any other such collecting of proximate positions.

The template 304 may be used to determine context for coding the enhancement-layer element as follows:

---
sum = (A != 0 ) + (B != 0) + (C != 0) + (E != 0) + (F != 0) + (I != 0)
ctxInc = min((sum+1)/2, 2)
---

In some implementations, the context for coding the DC coefficient may be determined once per frame, slice, or picture, etc., based upon a context determination using one of the above techniques in one transform unit. That determined context may be then shared/reused for coding the DC coefficients in other transform units in that frame/slice/picture/etc.

Example 7

In the foregoing examples, transform domain elements (such as coefficient level, significance flag, etc.) in the reference layer are used to determine context for coding an element in the enhancement layer. As noted above, the reference-layer transform domain coefficients correlate to the enhancement-layer transform domain coefficients in upper left region of the block of enhancement-layer transform domain coefficients. Many of the above examples propose that for enhancement-layer elements in the remainder of the block that context determination be based on usual single-layer context assignment schemes, i.e. without reference to the reference-layer data.

In a seventh example embodiment, the reference-layer data may also be used for determining context in the remainder of the enhancement-layer block by upscaling the transform domain block of reference-layer coefficients, applying a DCT operation, and quantizing to produce upscaled quantized transform domain coefficients. One of the template-based context-determination processes described above may then be used to determine context for enhancement-layer elements in the remainder of the enhancement-layer block in reliance upon the upscaled reference-layer coefficients.

In one embodiment, the upscaled reference-layer data may be used throughout the enhancement-layer block for determining context; however, in other embodiments the better-correlated non-upscaled reference-layer data is used for determining context for enhancement-layer elements (e.g. significance flags) in the upper left region corresponding to the reference-layer block, i.e. $x_0 \leq x \leq x_0+W/R$ and $y_0 \leq y \leq y_0+H/R$.

In one example embodiment, the enhancement-layer transform block is dealt with in 4×4 blocks, to correspond to the coefficient-group processing of blocks in encoding and decoding, irrespective of whether the corresponding reference-level block is 4×4 or larger. In such an example, the upper-left 4×4 coefficient group uses the direct-correlated reference-layer data for context determination, and the remaining coefficient groups in the enhancement-layer use either upscaled reference-layer data for context determination or conventional single-layer context determination (that does not refer to reference-layer data).

Example 8

In yet an eighth example embodiment, a conventional single-layer context model may be combined with one the above example reference-layer based context models to determine context for coding enhancement-layer elements.

Figure 8:
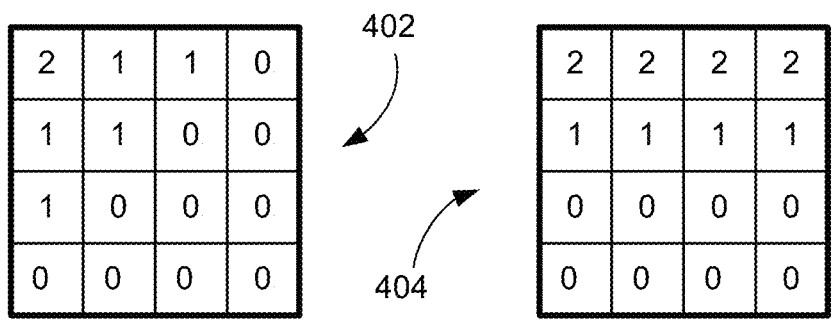
FIG. 8 shows example patterns for position-based determination of context.
Figure 8:
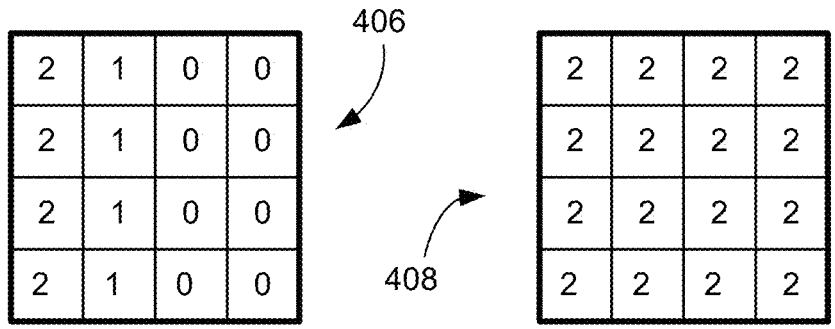

In HEVC/H.265 single-layer coding, the context for coding significant-coefficient flags for a 4×4 significant-coefficient group in a large transform unit is based on the pattern of its two neighboring significant-coefficient groups (right and below), and on the position of the coefficient within the coefficient group. FIG. 8 illustrates the position-based context pattern for four different scenarios. The first pattern 402 is applied to a coefficient group if neither its right neighbor nor its bottom neighbor coefficient groups contain non-zero coefficients. That is, the right and lower neighboring coefficient groups contain all zeros. In that case, context zero is used except in the upper-left position, which uses context 2, and in the five positions around the upper-left position, which use context 1.

Pattern 404 is applied when the right neighbor coefficient group contains at least one non-zero coefficient and when the bottom neighbor coefficient group contains no non-zero coefficients. Pattern 406 is applied when the bottom neighbor coefficient group contains at least one non-zero coefficient and when the right neighbor coefficient group contains no non-zero coefficients. Pattern 408 is applied when both the right and bottom neighbor coefficient groups each contain at least one non-zero coefficient.

If sigCtx is denoted the context derived using the above example HEVC/H.265 single-layer context selection process, then the combined context selection process for the enhancement layer of a scalable video coding process may be described as:

---
If i < $W_r$ and j < $H_r$
    sum = 2*($U_r$ (i, j) != 0) + ($U_r$ (i−1, j) != 0) + ($U_r$ (i, j−1) != 0) +
        ($U_r$ (i+1, j) != 0) + ($U_r$ (i, j+1) != 0)
    ctxInc = sigCtx * 3 + min( (sum + 1)/2, 2 )
Else
    Use conventional single-layer contexts
---

Note that this results in nine total possible contexts. In other words, the reference-layer data is used to sub-divide the single-layer contexts. This may result in more contexts that is desired. Accordingly, some may be combined to reduce the total number of contexts. In one example, this is implemented as:

---
If i < $W_r$ and j < $H_r$
    sum = 2*($U_r$ (i, j) != 0) + ($U_r$ (i−1, j) != 0) + ($U_r$ (i, j−1) != 0) +
        ($U_r$ (i+1, j) != 0) + ($U_r$ (i, j+1) != 0)
    ctxInc = min(2, sigCtx + min( (sum + 1)/2, 2 ))
Else
    Use conventional single-layer contexts
---

This results in 3 total contexts, although it incorporates both conventional pattern and position-based context determination and the above-described reference-layer-based context determination.

Other combinations and variations will be appreciated by those ordinarily skilled in the art in light of the description herein.

Although some of the foregoing examples focus upon the coding of enhancement-layer significant-coefficient flags using a context determined based upon reference-layer significant-coefficient flags, the present application is not limited to these syntax elements. Other enhancement-layer elements may be coded using context determined from reference-layer elements, including greater-than-one flags, greater-than-two flags, significant-coefficient-group flags. It will be understood that significant-coefficient groups are sometimes referred to in the art as "coded sub-blocks".

It will be understood that the transform domain elements of the reference layer used to select the context for coding the enhancement-layer element need not be the same. For example, context for coding a greater-than-one flag at the enhancement-layer may be based upon significant-coefficient flag data from the reference layer. In another example, significant-coefficient-group flags at the enhancement layer may be coded using a context determined based upon coefficient level data from the reference layer.

Multi-Level Significance Maps in Scalable Video and Multiview/3D Video

Multi-level significance maps are described in U.S. application Ser. No. 13/286,336, filed Nov. 1, 2011, and owned in common herewith, the contents of which are hereby incorporated by reference.

Multi-level significance maps refer to the coding of higher level significance data. In HEVC/H.265, this higher level data is referred to as coded sub-blocks. The coded sub-blocks (or, equivalently, "significant-coefficient groups") are 4×4 blocks of significant-coefficient flags. A coded sub-block flag is set or inferred to 1 if the significant-coefficient flags are known or presumed to include at least one non-zero coefficient. In that case, the significant-coefficient flags are encoded and decoded from the bitstream. If the coded sub-block flag is set to 0, then the sixteen corresponding significant-coefficient flags are all set to zero at the decoder.

The reference-layer may be encoded using HEVC/H.265-type encoding. That is, the reference layer may, in the case of some transform units, use significant-coefficient group flags and significant-coefficient flags to signal which of the coefficients are non-zero.

In accordance with one aspect of the present application, the applicants have noted that in scalable video coding, due to inter-layer prediction at the enhancement layer, the enhancement-layer residual blocks tend to be more sparse than those found in HEVC/H.265 single-layer coding. Similarly, in multiview/3D coding, due to the prediction at different views, the additional view residual blocks tend to be more sparse than those found in the HEVC/H.265 single view coding. As a result, the different statistics of the enhancement layer (or the additional views) may justify a different multi-level significance map coding scheme than is used at the reference layer.

In one example, if a transform unit is sufficiently sparse, such that most 8×8 blocks are zero, it may be beneficial to define 8×8 sized significant-coefficient groups and within those 8×8 significant-coefficient groups provide for 4×4 significant-coefficient sub-groups. In that case, the enhancement layer would have its significance map coded using a three-level significance map scheme, whereas the reference layer is coded using a two-level significance map scheme.

In another example, the significant-coefficient groups and/or significant-coefficient-sub-groups may be non-square. For example, a transform unit could be partitioned into 2×8 significant-coefficient groups. Each significant-coefficient group may then be partitioned into 2×2 significant-coefficient sub-groups.

In another example, if many of the 4×4 blocks are sparse, but not necessarily all zero, then it may be beneficial to retain 4×4 significant-coefficient groups and further define 2×2 significant-coefficient sub-groups within those significant-coefficient groups. Again, the enhancement layer in this case uses a three-level significance map signaling scheme. The significant-coefficient sub-group may be referred to as a coded sub-sub-block or any similar term.

Variations in the possible sizes and shapes of the groups and sub-groups will be appreciated by those ordinarily skilled in the art having regard to the description herein.

The significant-coefficient sub-group is coded using a significant-coefficient-sub-group flag. With the introduction of a new element, the significant-coefficient-sub-group flag, the context model may be modified or adapted to better signal the various significance map syntax elements.

Context Model Example 1

In a first example embodiment, the context determination for coding the significant-coefficient-sub-group flag is based upon the coefficients in neighboring significant-coefficient sub-groups.

Figure 9:
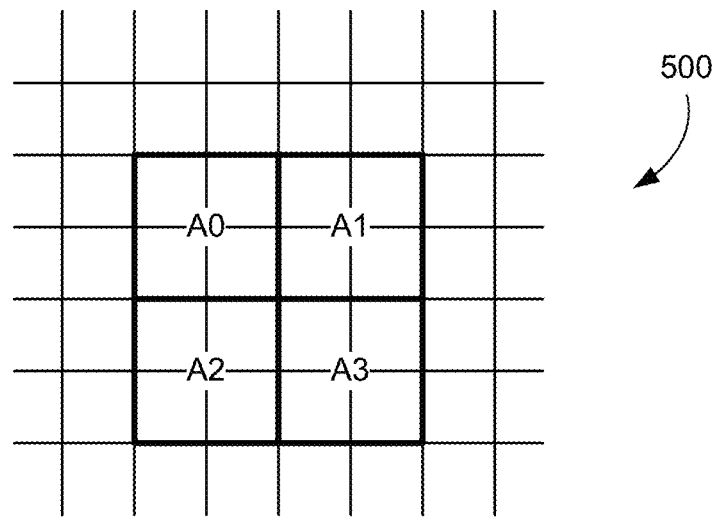
FIG. 9 shows an example set of 2×2 significant-coefficient sub-groups.

FIG. 9 shows a portion of an enhancement-layer transform unit. Four 2×2 significant-coefficient sub-groups are shown: A1, A2, A3, and A4. The four 2×2 significant-coefficient sub-groups may be within a single 4×4 coefficient group. The size of the transform unit 500 may be between 4×4 and 32×32.

The context model in this example embodiment may depend on the neighboring significant-coefficient sub-groups. In particular, in this case, upon the sub-groups to the right, below and below-right. That is, the context for coding the significant-coefficient-sub-group flag for A0 will depend on the "contents" of A1, A2 and A3. The "contents" may refer to whether there are any non-zero coefficients in those sub-groups, the sum of the absolute value of the coefficients in those sub-groups, etc. In one example, the absolute value of the sum of the coefficients is denoted sumA1, sumA2 and sumA3, for each respective neighboring sub-group. The context for coding the significant-coefficient sub-group flag for A0 may be given by:

```
If sumA1 > Th1 or sumA2 > Th2 or sumA3 > Th3
    ctxInc = 1
Else
    ctxInc = 0
where Th1, Th2, Th3 are given thresholds.
```

When Th1=Th2=Th3=0, the scheme corresponds to testing if any one of the significant-coefficient-sub-group flags of A1, A2, and A3 is '1'.

Context Model Example 2

In a second example embodiment, context derivation for coding the enhancement-layer significant-coefficient-sub-group flags may be position based, where the positional context pattern for a set of significant-coefficient sub-groups is based on nearby or neighboring significant-coefficient sub-groups.

Figure 10:
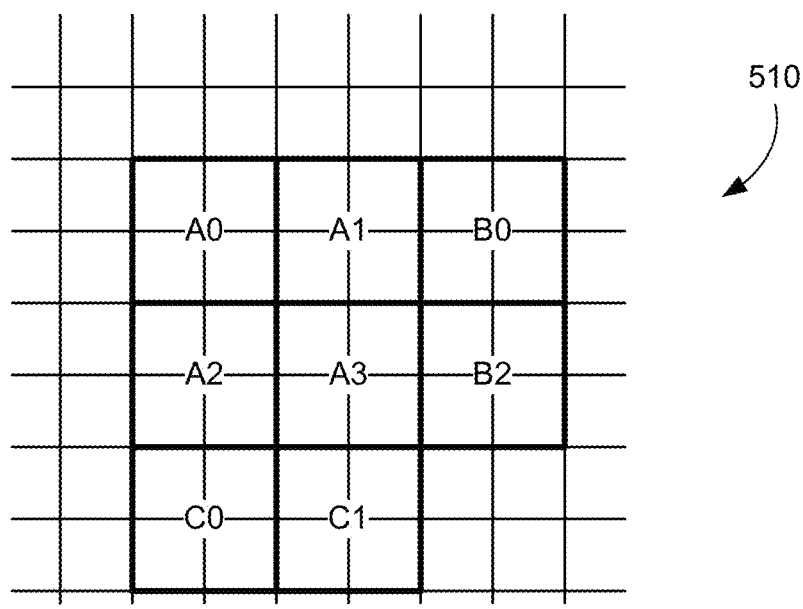
FIG. 10 illustrates an example set of 2×2 significant-coefficient sub-groups and their neighboring sub-groups.

As an illustrative example, FIG. 10 shows a portion of a transform unit 510 in the enhancement layer. A set of four 2×2 significant-coefficient sub-groups is labeled A0, A1, A2, and A3. The set of four 2×2 sub-groups forms a single 4×4 significant-coefficient group. In this example, the pattern selection for context determination is based on the neighboring significant-coefficient sub-groups B0, B2, C0, and C1; although, in another example it could be based upon the neighboring 4×4 significant-coefficient group.

Figure 11:
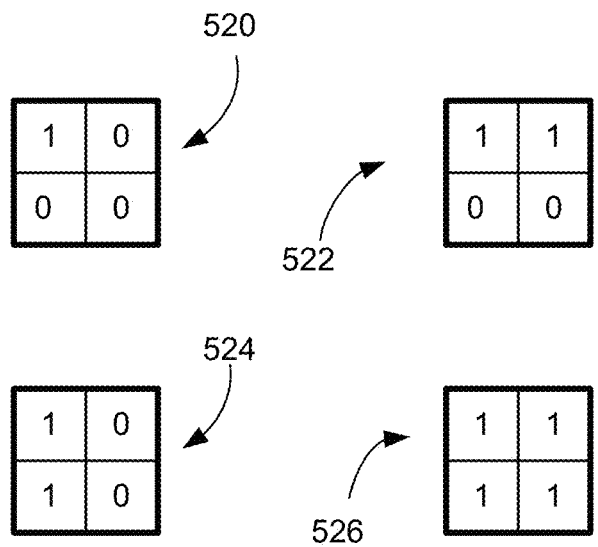
FIG. 11 shows example patterns for position-based determination of context in coding significant-coefficient sub-group flags.

The respective contexts for coding the significant-coefficient-sub-group flags of A0, A1, A2, and A3 is shown in FIG. 11, which shows the four patterns that may be used in this example. A first pattern 520 is used when there are no non-zero coefficients in C0, C1, B0, and B2. The entropy coder may determine this from the significant-coefficient-sub-groups flags for B0, B2, C0, and C1. If they are all zero, then the first pattern 520 is used to select the contexts for coding the significant-coefficient-sub-group flags for A0, A1, A2 and A3 based on their positions in the coefficient group. In this example pattern, the significant-coefficient-sub-group flag for A0 is coded using context 1. The significant-coefficient-sub-group flags for the other sub-groups A1, A2, and A3 are all coded using context 0.

Pattern 522 is used if there are no non-zero coefficients in C0 and C1, but at least one non-zero coefficient in either B0 or B2. Pattern 524 is used if there are no non-zero coefficients in B0 or B2, but at least one non-zero coefficient in either C0 or C1. Finally, pattern 526 is used if there is at least one non-zero coefficient in either C0 or C1 and at least one non-zero coefficient in either B0 or B2.

Context Model Example 3

Figure 12:
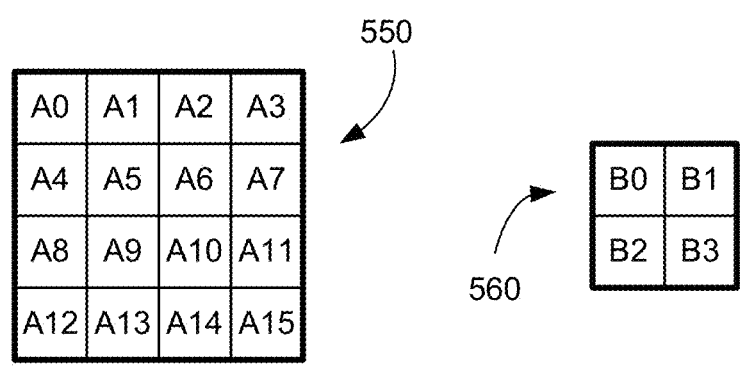
FIG. 12 shows an enhancement layer transform unit partitioned into 2×2 significant-coefficient sub-groups and the corresponding reference layer transform block partitioned into 2×2 sub-blocks.

In a third example, reference-layer data may be used to determine context for coding significant-coefficient-sub-group flags at the enhancement layer. Any of the template examples described above for determining context based on reference-layer transform domain coefficients may be used in various embodiments. To illustrate one example, FIG. 12 shows an example 8×8 enhancement-layer block of transform domain coefficients 550 partitioned into 2×2 significant-coefficient sub-blocks denoted A0, A1, . . . , A15. As discussed above, the 8×8 enhancement layer block has a corresponding 4×4 block at the reference layer. The corresponding reference layer block is denoted 560. Although the reference layer coding does not employ 2×2 significant-coefficient sub-block partitioning, for the purpose of enhancement-layer context derivation the 4×4 reference-layer block is partitioned into 2×2 sub-blocks denoted B0, B1, B2 and B3.

The context derivation schemes discussed above based upon reference-layer data may then be used for context determination for coding significant-coefficient-sub-block flags at the enhancement layer. For example, to code the flag for A0, context may be derived based upon its corresponding/correlated reference layer sub-block: B0. In the case of a template that uses neighboring positions, the context for A0 may partly depend upon B0 and reference-layer neighbors B1 and B2.

The enhancement-layer coefficient block of size $W_e \times H_e$ may be denoted $U_e$. The corresponding reference-layer transform unit is $U_r$, which is of size $W_r \times H_r$. The enhancement-layer significant-coefficient-sub-block flags form a binary block $F_e$. Similarly, although the reference-layer does not use 2×2 sub-block flags in its coding, sub-block flags may be defined such that they form a binary block of size $W_r/2 \times H_r/2$ denoted $F_r$.

sigCGCtx may be defined as the context derived using the position-based process described above in Context Model Example 2. The reference-layer-based context determination scheme may be supplemental to the position-based scheme, similar to what is described in Example 8, above. In such an example, the context determination may be defined as:

If $i < W_r/2$ and $j < H_r/2$
  sum = $(F_r(i, j) \mathrel{!{=}} 0) + (F_r(i-1, j) \mathrel{!{=}} 0) + (F_r(i, j-1) \mathrel{!{=}} 0)$
  ctxInc = min(2, sigCGCtx + sum )
Else
  ctxInc = 3 + sigCGCtx In another example, the values of the coefficients at the reference layer may be used instead of reference-layer sub-block flags. Such a context determination process may be defined as:

If $i < W_r/2$ and $j < H_r/2$
  sumAbs0 = abs( $U_r(2^*i, 2^*j)$ ) + abs( $U_r(2^*i+1, 2^*j)$ ) + abs( $U_r(2^*i, 2^*j+1)$ )
  sumAbs1 = abs( $U_r(2^*i+2, 2^*j)$ ) + abs( $U_r(2^*i+3, 2^*j)$ ) + abs( $U_r(2^*i+2, 2^*j+1)$ )
  sumAbs2 = abs( $U_r(2^*i, 2^*j+2)$ ) + abs( $U_r(2^*i+1, 2^*j+2)$ ) + abs( $U_r(2^*i, 2^*j+3)$ )
  sum = (subAbs0 > Th0) + (subAbs0 > Th1) + (subAbs0 > Th2)
  ctxInc = min(2, sigCGCtx + sum )
Else
  ctxInc = 3 + sigCGCtx Last Position Coding for Enhancement-Layer Blocks In HEVC/H.265, the last-significant coefficient is usually signaled by coding its coordinates (x, y) in the transform unit relative to the top-left corner. The decoder is then able to decode only significant coefficients (and higher level significance map elements) from the x, y position back towards the top-left corner in reverse scan order (e.g. from bottom right to top left in zig zag, horizontal, vertical, or diagonal scan pattern).

In the case where the enhancement-layer uses a 2×2 significant-coefficient-sub-group, it may be advantageous to code the coordinates of the last-significant-coefficient-sub-group instead of the (x, y) coordinates of the last-significant coefficient. To do so, the pair (floor(x/2), floor(y/2)) is coded. This provides the position of the significant-coefficient-sub-group (and thus the significant-coefficient group) that contains the last-significant-coefficient. No significant-coefficient-group flag or significant-coefficient-sub-group flag is coded for those that contain the last-significant coefficient and all four significant-coefficient flags of the last-significant-coefficient sub-group are coded.

This results in a likely savings in the coding of the last significant coefficient location information because the values are cut in half for both x and y, at the cost of possibly coding additional significant coefficient flags beyond the last significant coefficient. The small sub-group size of 2×2 limits that cost, and may result in an overall compression improvement.

Three-Stage Scanning Order for Enhancement-Layer Blocks

With the significant-coefficient-sub-group in the enhancement layer for coding the position information (including the significance flags and the last position), the scanning order is determined by three stages. First, at the whole block stage, a given scan, such as diagonal scan, or horizontal scan, or vertical scan, is applied to the whole block for each coefficient group; within each coefficient group, another scan, either the same as or different from the scan on the whole block stage, is applied for each coefficient sub-group; within each coefficient sub-group, a scan, either the same as or different from scans in previous stages, is applied for each significance flags.

In one example embodiment, all significant-coefficient-group flags of a block are coded first following the coefficient group scanning order. Then all significant-coefficient-sub-group flags of the block are coded for those coefficient groups with non-zero significant-coefficient-group flags following the significant-coefficient-sub-group scanning order. The significant-coefficient flags are then coded for coefficients in significant-coefficient sub-groups with non-zero significant-coefficient-sub-group flags following the significant-coefficient scanning order.

In another example embodiment the different types of flags are interleaved. In such an example, the coefficient groups of a block are processed in the coefficient group scanning order. For each coefficient group, the significant-coefficient-group flag is coded first. If the flag is non-zero, the four significant-coefficient-sub-group flags are coded in the significant-coefficient-sub-group scanning order. The significant-coefficient flags for the sub-groups with non-zero significant-coefficient sub-group flags are then coded in the significant-coefficient scanning order.

The scanning order for the levels (non-zeros) coding, however, may be different from the scanning order for the position (significance map) information. For example, for level coding in the enhancement layer, at the coefficient-group stage, the same scanning that used for the reference layer can still be used. One benefit of doing this is to avoid interrupting the coefficient-group-based sign-data hiding. Alternatively, the sign-bit-hiding may be applied to the coefficient-sub-group stage, and then the scanning order for level coding may also employ the three-stage scanning order as described in the above for the position information coding.

Context Model for Coding Significant-Coefficient Flags in the Three-Stage Scanning With three-stage scanning, all significant-coefficient-group flags and significant-coefficient-sub-group flags of the whole block may be coded before coding the significant-coefficient flags. The context for coding the significant-coefficient flags of the coefficients in one significant-coefficient-sub-group may then be determined based upon all of its neighboring significant-coefficient-group flags and significant-coefficient-sub-group flags.

In an example embodiment, the context determination for coding the significant-coefficient flag is based upon the significant-coefficient-sub-group flags of the four direct neighboring significant-coefficient sub-groups. FIG. 12 shows an example 8×8 enhancement-layer block of transform domain coefficients 550 partitioned into 2×2 significant-coefficient sub-blocks denoted A0, A1, . . . , A15. The context model in this example embodiment may depend on the significant-coefficient-sub-group flags of the sub-groups to the above, left, right, and below. That is, the context for coding the significant-coefficient flags for A5 will depend on the significant-coefficient-sub-group flags of A1, A4, A6, and A9, denoted as flagA1, flagA4, flagA6, and flagA9. In one example, a single context is used for coding all four significant-coefficient flags and the context determination may be defined as:

```
If flagA1 + flagA4 + flagA6 + flagA9 > Th2
    ctxInc = 2
Else if flagA1 + flagA4 + flagA6 + flagA9 > Th1
    ctxInc = 1
Else
    ctxInc = 0
where Th1, Th2, Th3 are given thresholds
```

Context Model for Coding Greater-than-One Flags

Figure 13:
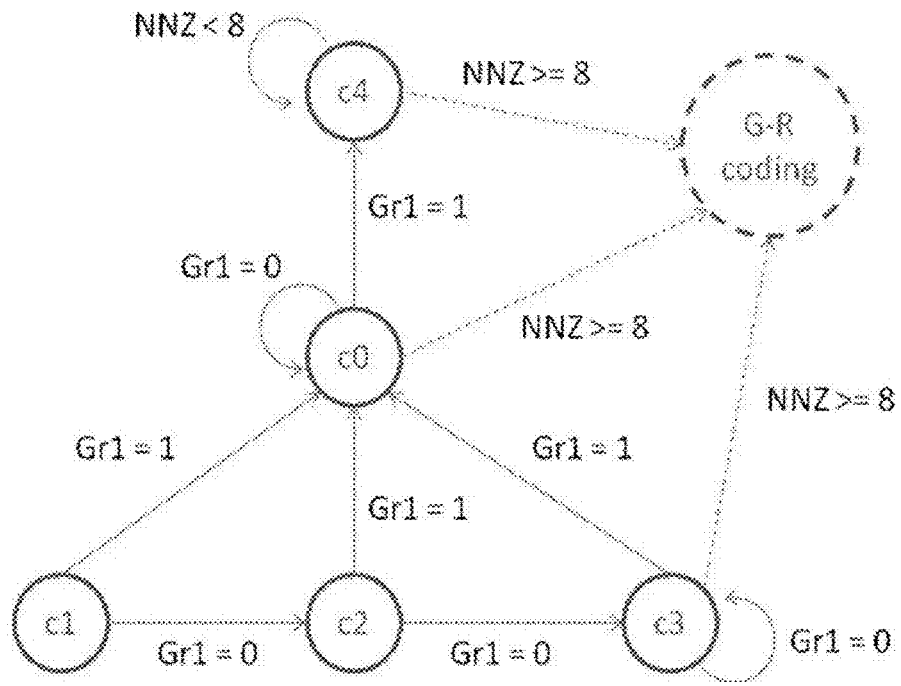
FIG. 13 shows an example state diagram for determining context for coding enhancement-layer greater-than-one flags.

At the enhancement layer, it may be advantageous to provide for an additional context that is used when a second non-zero greater-than-one flag is encountered in a transform unit. An example state diagram for one implementation of such a context model is shown in FIG. 13. In this example context C4 is reached when a second non-zero greater-than-one flag is encoded or decoded for the transform unit.

Modified Scan Order for Enhancement Layer Coding

In the case of spatial scalability, the reference layer is a down-scaled version of the enhancement layer. Downscaling effectively removes higher frequency components and retains lower frequency components. When using inter-layer prediction, the reference layer (a low frequency representation of the video) is upscaled and subtracted from the enhancement layer. This tends to results in the removal of the low frequency components, meaning that the residual in the enhancement layer tends to have fewer than normal low frequency components as compared to the residual for which single-layer coding is designed. In single-layer coding, the elements are processed in reverse scan order, i.e. from bottom right to top left, on the basis of the assumption that the data is heavily concentrated in the low frequency components near the top left of the transform units. Accordingly, when processing enhancement layer transform data, or at least enhancement layer transform coefficients resulting from inter-layer prediction, a modified scan order may be advantageous.

Figure 14:
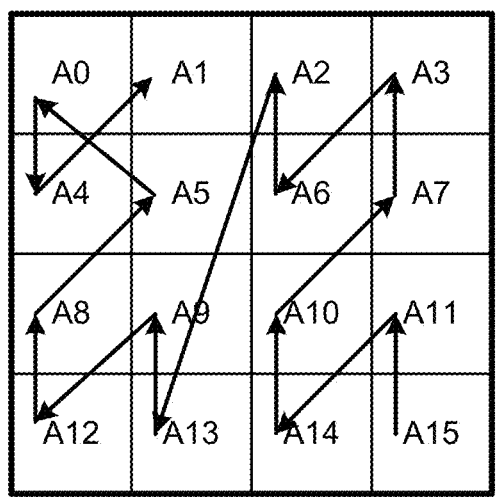
FIG. 14 shows an example of a modified sub-group reverse scan order.

FIG. 14 shows a modified reverse sub-group scan order for 2×2 significant-coefficient sub-groups. Normally, the upper left coefficient group containing sub-groups A0, A1, A4, and A5 would be scanned in the order A5, A1, A4, A0. In this modified example, the sub-groups are scanned in the order A5, A0, A4, A1. In another example, this may be implemented by swapping the data in sub-groups A1 and A0 and applying the conventional reverse scan order. Other variations of modifying the reverse scan order and/or swapping sub-groups to cause reordered processing will be appreciated in light of this discussion and in light of the residual block rotation scheme described in U.S. application Ser. No. 13/533,337 filed Jun. 26, 2012, and owned in common herewith, the contents of which are hereby incorporated by reference.

Figure 15:
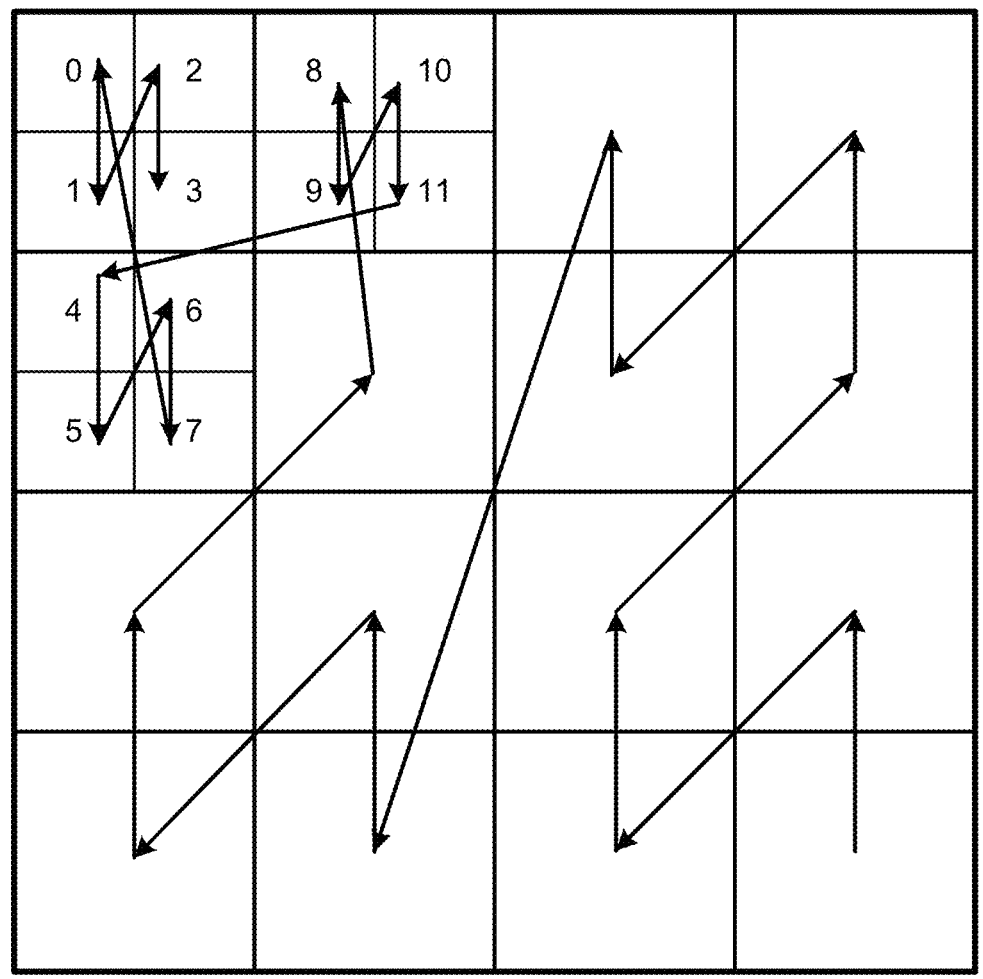
FIG. 15 shows another example of a modified reference scan order.

In another example embodiment, the sub-group scanning order may be the conventional reverse scan order, but the coefficient scanning order within one or more sub-groups in the upper left coefficient group may be modified to occur in forward scan order. FIG. 15 illustrates an example in which significant-coefficient groups and significant-coefficient sub-groups are scanned in reverse diagonal scan order. Within significant-coefficient sub-groups, the significant-coefficient flags are scanned in reverse diagonal scan order, except for the three upper left significant-coefficient sub-groups denoted 602, 604, and 606. Coefficients (numbered 0 to 11) within those sub-groups are scanned in forward scan order. In one implementation this modified scan order can be implemented through sub-group rotation and application of the reverse scan order within the sub-group.

Template-Based Rice Parameter Selection

In single-layer/view coding, a Golumb-Rice code is used to encode/decode the remaining level data for a coefficient. The Rice parameter is determined based upon the level of the immediately preceding coded coefficient. In one aspect, the determination of the Rice parameter for coding level data at the enhancement layer (or other views) may be based upon a plurality of neighboring or nearby coefficients, whether applied to data at the reference layer or the enhancement layer/other views. The Rice parameter selection may be based upon a sum of levels of nearby coefficients. For example at the enhancement layer three to five neighbouring previously coded coefficients may be selected by the template. An example template, in which the X indicates the coefficient being coded and the 0 indicates the coefficients selected by the template, is as follows:

$$X\ 0\ 0$$
$$0\ 0$$
$$0$$

If the template for Rice parameter selection is relying upon correlated reference layer coefficients, then the cross-template discussed above may be applied.

Although many of the foregoing embodiments specifically describe aspects of the present application applied to scalable video coding, as mentioned above, these aspects may equally be applied to multiview and/or 3D coding. To the extent that the terms "enhancement layer" and "reference layer" have been used in the foregoing description, they may be consider to include the terms "additional view(s)" and "single view" for embodiments in which these aspects are applied to multiview/3D coding.

Figure 16:
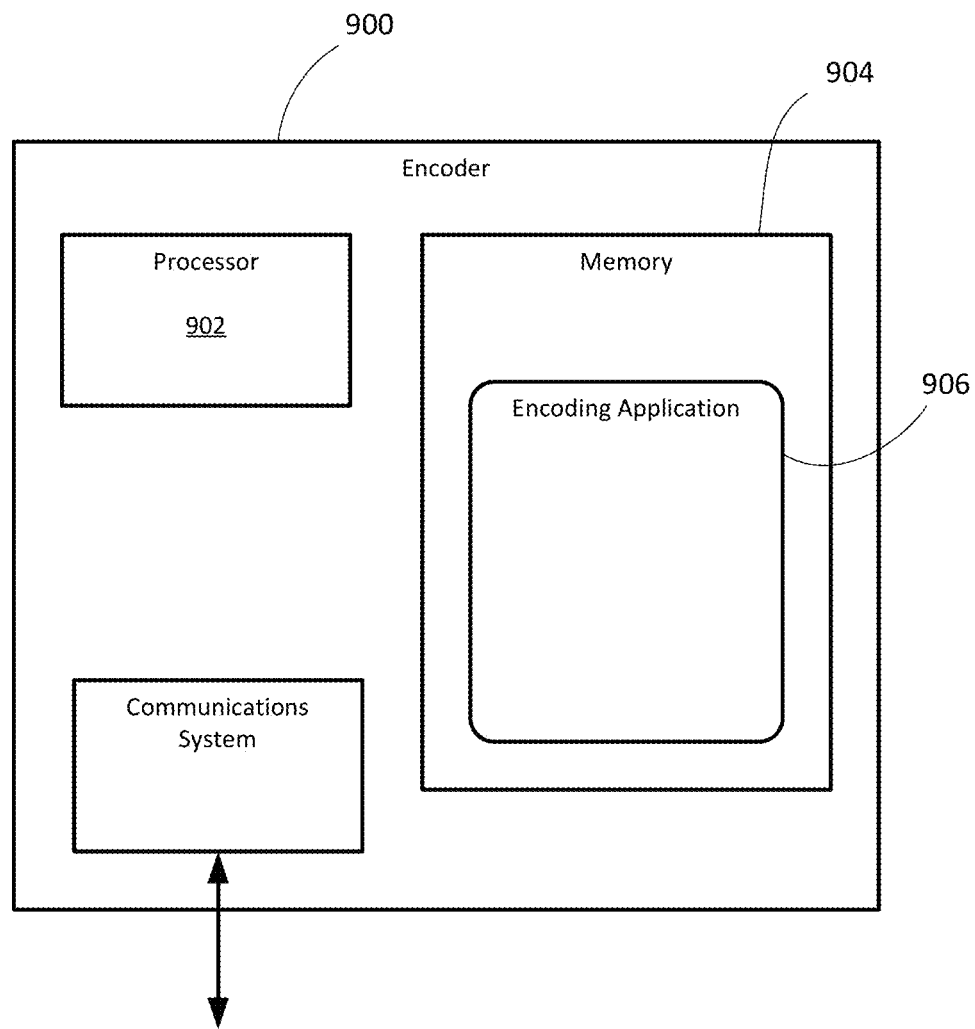
FIG. 16 shows a simplified block diagram of an example embodiment of an encoder.

Reference is now made to FIG. 16, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform operations such as those described herein. For example, the encoding application 906 may encode and output a bitstream encoded in accordance with the processes described herein. It will be understood that the encoding application 906 may be stored in on a computer readable medium, such as a compact disc, flash memory device, random access memory, hard drive, etc.

Figure 17:
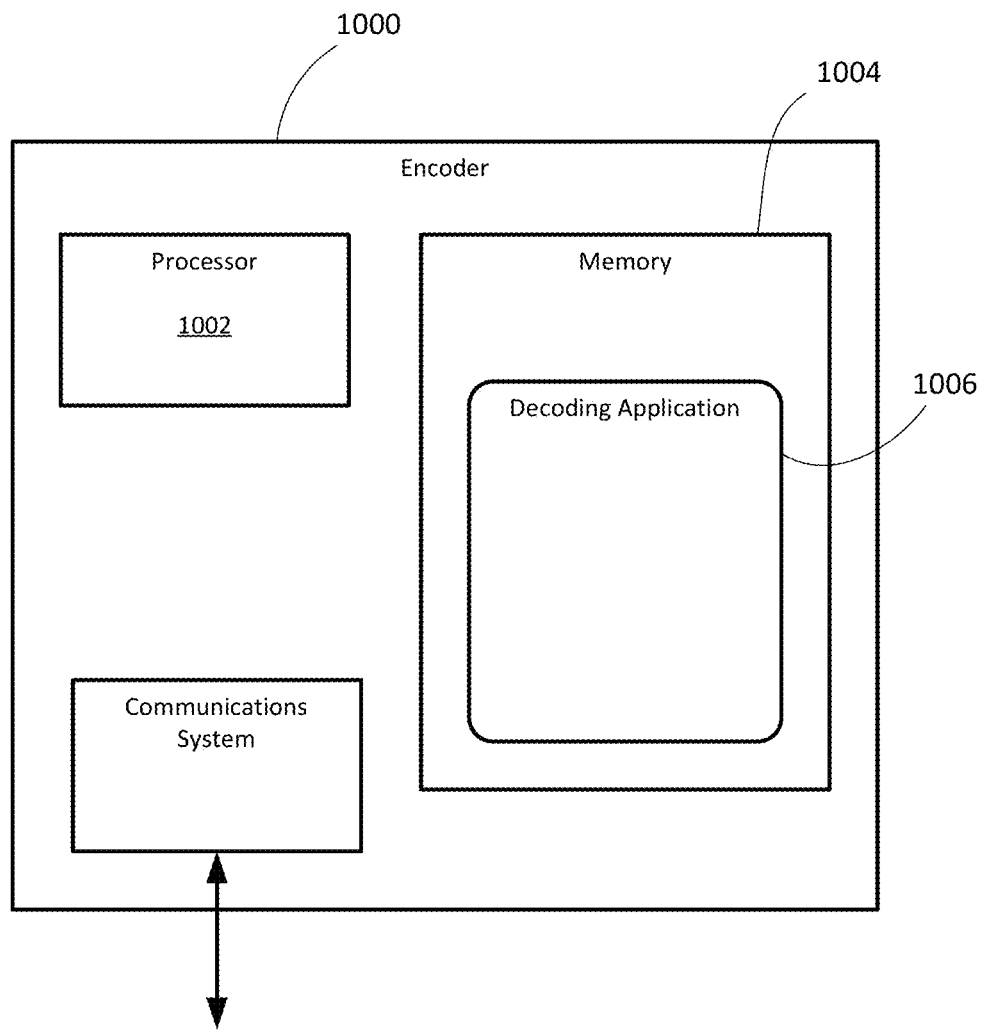
FIG. 17 shows a simplified block diagram of an example embodiment of a decoder.

Reference is now also made to FIG. 17, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform operations such as those described herein. It will be understood that the decoding application 1006 may be stored in on a computer readable medium, such as a compact disc, flash memory device, random access memory, hard drive, etc.

It will be appreciated that the decoder and/or encoder according to the present application may be implemented in a number of computing devices, including, without limitation, servers, suitably-programmed general purpose computers, audio/video encoding and playback devices, set-top television boxes, television broadcast equipment, and mobile devices. The decoder or encoder may be implemented by way of software containing instructions for configuring a processor to carry out the functions described herein. The software instructions may be stored on any suitable non-transitory computer-readable memory, including CDs, RAM, ROM, Flash memory, etc.

It will be understood that the encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of decoding, in a video decoder, a block of enhancement-layer transform domain data for an encoded video and corresponding to a reconstructed block of reference-layer transform domain data, the method comprising:
for an enhancement-layer element of the block of enhancement-layer transform domain data, wherein the block of enhancement-layer transform domain data is of size W×H, wherein the reconstructed block of reference-layer transform domain data is of size W/R×H/R, and wherein R comprises a non-unity scale factor, determining whether the enhancement-layer element is located in an upper-left W/R×H/R portion of the block of enhancement-layer transform domain data and,
if the enhancement-layer element is within the upper left W/R×H/R portion, determining a context for that enhancement-layer element based, at least in part, upon a plurality of elements in the reconstructed block of reference-layer transform domain data without upscaling, wherein the plurality of elements are identified by a template that selects the plurality of elements in the reference-layer and wherein the position of the template in the reconstructed block of reference-layer transform domain data is based upon the position of that enhancement-layer element in the block of enhancement-layer transform domain data, and
if the enhancement-layer element is not within the upper left W/R×H/R portion, determining the context for that enhancement-layer element using single-layer contexts;
entropy decoding that enhancement-layer element using its determined context; and
reconstructing and outputting for display a block of image data based on the block of enhancement-layer transform domain data.

2. The method claimed in claim 1, wherein the template includes an element in the same position in the reconstructed block of reference-layer transform domain data as the position of that enhancement-layer element in the block of enhancement-layer transform domain data.

3. The method claimed in claim 2, wherein the template further includes two or more elements neighboring the element in the same position.

4. The method claimed in claim 3, wherein the template includes elements to the right, above, below and to the left of the element in the same position.

5. The method claimed in claim 1, wherein the template includes elements in a neighborhood defined around a position in the reconstructed block of reference-layer transform domain data corresponding to the position of that enhancement-layer element in the block of enhancement-layer transform domain data.

6. The method claimed in claim 1, wherein the elements in the reconstructed block of reference-layer transform domain data are the same type of syntax elements as the enhancement-layer element.

7. The method claimed in claim 6, wherein the enhancement-layer element comprises a significant-coefficient flag, and wherein the elements in the reconstructed block of reference-layer transform domain data comprise a reference-layer significant-coefficient flags.

8. The method claimed in claim 1, wherein the elements in the reconstructed block of reference-layer transform domain data are a different type of syntax element from the enhancement-layer element.

9. The method claimed in claim 1, wherein determining context further comprises, for another enhancement-layer element located outside the upper left W/R×H/R portion of the block of enhancement layer transform domain data, determining context based, at least in part, upon the upscaled elements of the reconstructed block of reference-layer transform domain data.

10. A decoder for decoding a block of enhancement-layer transform domain data for an encoded video and corresponding to a reconstructed block of reference-layer transform domain data, the decoder comprising:
   a processor;
   a memory; and
   a decoding application stored in memory and containing instructions for configuring the processor to, for an enhancement-layer element of the block of enhancement-layer transform domain data, wherein the block of enhancement-layer transform domain data is of size W×H, wherein the reconstructed block of reference-layer transform domain data is of size W/R×H/R, and wherein R comprises a non-unity scale factor:
      determine whether the enhancement-layer element is located in an upper-left W/R×H/R portion of the block of enhancement-layer transform domain data and,
         if the enhancement-layer element is within the upper left W/R×H/R portion, determine a context for that enhancement-layer element based, at least in part, upon a plurality of elements in the reconstructed block of reference-layer transform domain data without upscaling, wherein the plurality of elements are identified by a template that selects the plurality of elements in the reference-layer and wherein the position of the template in the reconstructed block reference-layer of transform domain data is based upon the position of that enhancement-layer element in the block of enhancement-layer transform domain data, and
         if the enhancement-layer element is not within the upper left W/R×H/R portion, determine the context for that enhancement-layer element using single-layer contexts;
      entropy decode that enhancement-layer element using its determined context; and
      reconstruct and output for display a block of image data based on the block of enhancement-layer transform domain data.

11. The decoder claimed in claim 10, wherein the template includes an element in the same position in the reconstructed block of reference-layer transform domain data as the position of that enhancement-layer element in the block of enhancement-layer transform domain data.

12. The decoder claimed in claim 11, wherein the template further includes two or more elements neighboring the element in the same position.

13. The decoder claimed in claim 12, wherein the template includes elements to the right, above, below and to the left of the element in the same position.

14. The decoder claimed in claim 10, wherein the template includes elements in a neighborhood defined around a position in the reconstructed block of reference-layer transform domain data corresponding to the position of that enhancement-layer element in the block of enhancement-layer transform domain data.

15. The decoder claimed in claim 10, wherein the elements in the reconstructed block of reference-layer transform domain data are the same type of syntax elements as the enhancement-layer element.

16. The decoder claimed in claim 15, wherein the enhancement-layer element comprises a significant-coefficient flag, and wherein the elements in the reconstructed block of reference-layer transform domain data comprise a reference-layer significant-coefficient flags.

17. The decoder claimed in claim 10, wherein the elements in the reconstructed block of reference-layer transform domain data are a different type of syntax element from the enhancement-layer element.

18. The decoder claimed in claim 10, wherein the processor is further configured to for another enhancement-layer element located outside the upper left W/R×H/R portion of the block of enhancement layer transform domain data, determine context based, at least in part, upon the upscaled elements of the reconstructed block of reference-layer transform domain data.

19. A non-transitory processor-readable medium storing processor-executable instructions which, when executed, cause one or more processors to decode a block of enhancement-layer transform domain data for an encoded video and corresponding to a reconstructed block of reference-layer transform domain data, wherein the instructions, when executed, cause the one or more processors to:
   for an enhancement-layer element of the block of enhancement-layer transform domain data, wherein the block of enhancement-layer transform domain data is of size W×H, wherein the reconstructed block of reference-layer transform domain data is of size W/R×H/R, and wherein R comprises a non-unity scale factor,
      determine whether the enhancement-layer element is located in an upper-left W/R×H/R portion of the block of enhancement-layer transform domain data and,
         if the enhancement-layer element is within the upper left W/R×H/R portion, determine a context for that enhancement-layer element based, at least in part, upon a plurality of elements in the reconstructed block of reference-layer transform domain data without upscaling, wherein the plurality of elements are identified by a template that selects the plurality of elements in the reference-layer and wherein the position of the template in the reconstructed block of reference-layer transform domain data is based upon the position of that enhancement-layer element in the block of enhancement-layer transform domain data, and
         if the enhancement-layer element is not within the upper left W/R×H/R portion, determine the context for that enhancement-layer element using single-layer contexts;

entropy decode that enhancement-layer element using its determined context; and reconstruct and output for display a block of image data based on the block of enhancement-layer transform domain data.

* * * * *